(12) United States Patent
Huang et al.

(10) Patent No.: US 12,288,758 B2
(45) Date of Patent: Apr. 29, 2025

(54) POLYIMIDE PROFILE CONTROL

(71) Applicant: Taiwan Semiconductor Manufacturing Company, Ltd., Hsinchu (TW)

(72) Inventors: Chen-Chi Huang, Hsinchu (TW); Chang-Yao Huang, New Taipei (TW); Po-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,834

(22) Filed: Aug. 9, 2023

(65) Prior Publication Data
US 2023/0387050 A1 Nov. 30, 2023

Related U.S. Application Data

(62) Division of application No. 17/468,871, filed on Sep. 8, 2021, now Pat. No. 11,855,015.
(Continued)

(51) Int. Cl.
*H01L 23/00* (2006.01)
*G03F 7/00* (2006.01)

(52) U.S. Cl.
CPC .......... *H01L 24/02* (2013.01); *G03F 7/70925* (2013.01); *H01L 24/03* (2013.01); *H01L 24/04* (2013.01); *H01L 24/05* (2013.01); *H01L 24/11* (2013.01); *H01L 24/13* (2013.01); *H01L 2224/02141* (2013.01); *H01L 2224/02145* (2013.01); *H01L 2224/0215* (2013.01); *H01L 2224/0362* (2013.01); *H01L 2224/0401* (2013.01); *H01L 2224/05569* (2013.01);
(Continued)

(58) Field of Classification Search
CPC ......... H01L 24/02; H01L 24/04; H01L 24/05; H01L 24/13; H01L 2224/0401; H01L 2224/05569; H01L 2224/05573; H01L 2224/13005; H01L 2224/1357; H01L 2924/07025; H01L 2224/13082; H01L 21/0271; H01L 21/76877
See application file for complete search history.

(56) References Cited

U.S. PATENT DOCUMENTS 6,383,909 B1  5/2002 Nagaya et al.
7,911,012 B2  3/2011 Leedy
(Continued)

OTHER PUBLICATIONS

Decision to grant patent, Application No. 11420051810, Jan. 13, 2025, 3 pages, Taiwan Search Report.

*Primary Examiner* — Douglas W Owens
(74) *Attorney, Agent, or Firm* — Sterne, Kessler, Goldstein & Fox P.L.L.C.

(57) ABSTRACT

A structure includes a controlled polyimide profile. A method for forming such a structure includes depositing, on a substrate, a photoresist containing polyimide and performing a first anneal at a first temperature. The method further includes exposing the photoresist to a radiation source through a photomask having a pattern associated with a shape of a polyimide opening. The method further includes performing a second anneal at a second temperature and removing a portion of the photoresist to form the polyimide opening. The method further includes performing a third anneal at a third temperature and cleaning the polyimide opening by ashing.

20 Claims, 9 Drawing Sheets

Related U.S. Application Data

(60) Provisional application No. 63/178,084, filed on Apr. 22, 2021.

(52) U.S. Cl.
CPC ............... *H01L 2224/05573* (2013.01); *H01L 2224/11462* (2013.01); *H01L 2224/13005* (2013.01); *H01L 2224/13147* (2013.01); *H01L 2224/1357* (2013.01); *H01L 2224/141* (2013.01); *H01L 2924/07025* (2013.01); *H01L 2924/2064* (2013.01); *H01L 2924/20752* (2013.01); *H01L 2924/20753* (2013.01); *H01L 2924/20754* (2013.01)

(56) References Cited

U.S. PATENT DOCUMENTS

| | | | |
|---|---|---|---|
| 11,855,017 B2* | 12/2023 | Yang | ........................ H01L 24/14 |
| 11,955,423 B2* | 4/2024 | Yang | ........................ H01L 24/14 |
| 2007/0037406 A1 | 2/2007 | Park et al. | |
| 2010/0279489 A1 | 11/2010 | Wang | |
| 2019/0333862 A1 | 10/2019 | Wang et al. | |
| 2020/0035596 A1* | 1/2020 | Kao | ........................ H01L 24/05 |
| 2022/0059346 A1 | 2/2022 | Yamaguchi et al. | |
| 2022/0367390 A1* | 11/2022 | Wu | ......................... H01L 24/03 |

* cited by examiner

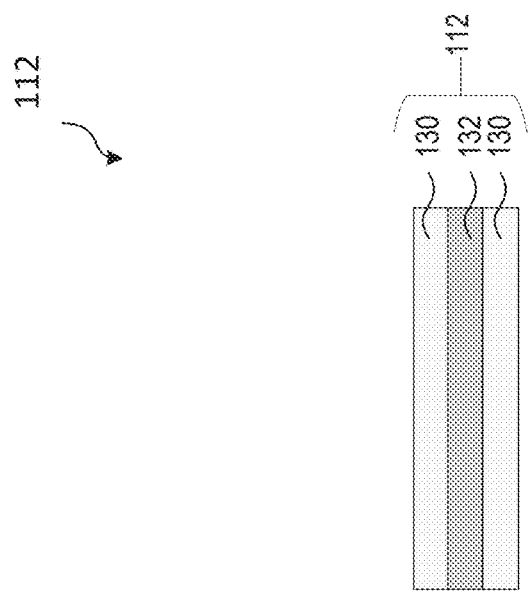
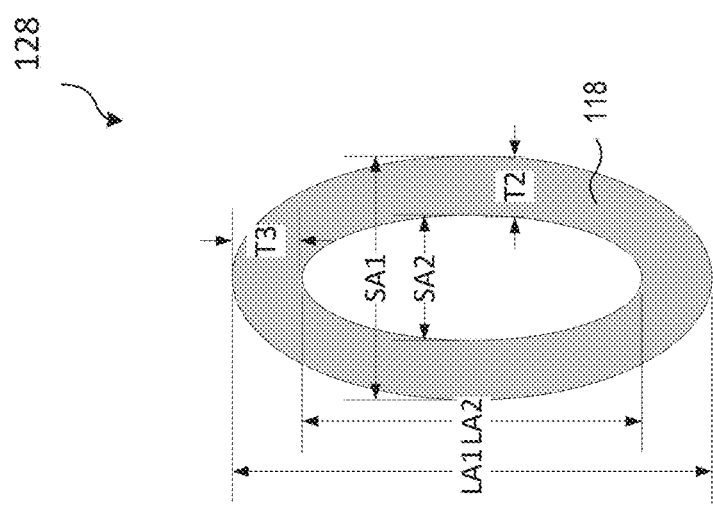
FIG. 1E
FIG. 1D

POLYIMIDE PROFILE CONTROL

CROSS-REFERENCE TO RELATED APPLICATION

This application is a divisional of U.S. Non-provisional patent application Ser. No. 17/468,871, filed on Sep. 8, 2021 and titled "Polyimide Profile Control," which claims the benefit of U.S. Provisional Patent Application No. 63/178,084, filed on Apr. 22, 2021 and titled "A Novel Methodology for Polyimide Profile Control," both of which are incorporated by reference herein in their entireties.

BACKGROUND

Polyimide can be used in bumping processes in wafer level packaging (WLP) and integrated fan-out (InFO) packaging. Polyimide can be used as a protective layer and buffer layer because of its heat resistance, thermal expansion, and mechanical properties. With scaling down of semiconductor device sizes, a thicker polyimide protective layer with improved mechanical strength may be required.

BRIEF DESCRIPTION OF THE DRAWINGS

Aspects of the present disclosure are best understood from the following detailed description when read with the accompanying figures.

FIGS. 1C and 1D illustrate top views of a portion of a polyimide layer, in accordance with some embodiments.

FIG. 1E illustrates a cross-sectional view of a metal-insulator-metal (MIM) structure, in accordance with some embodiments.

DETAILED DESCRIPTION

Figure 1A:
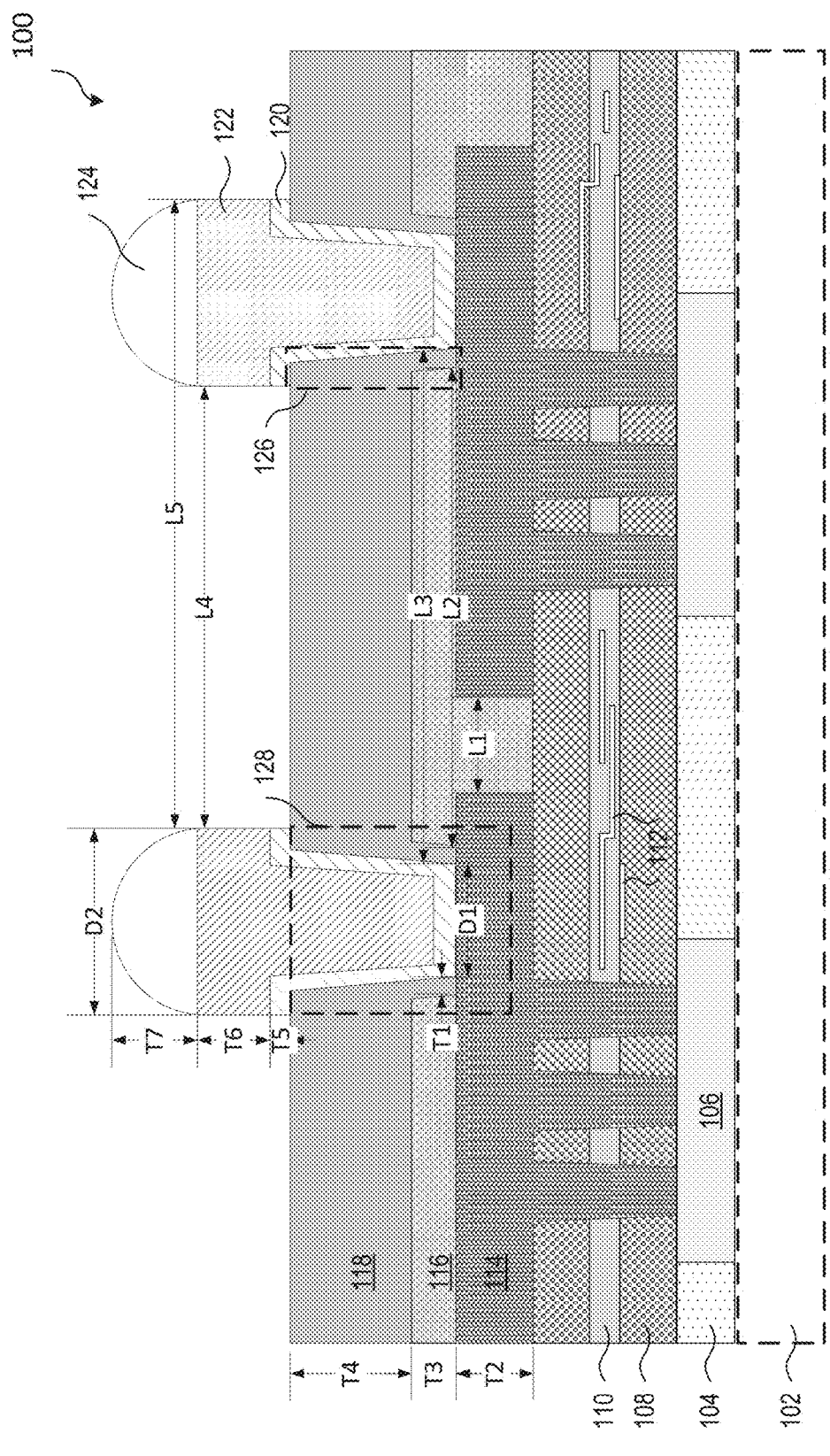
FIG. 1A illustrates a cross-sectional view of a semiconductor structure with a polyimide layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1E, 4-9, and 10A-10B with the same annotations applies to each other, unless mentioned otherwise.

Polyimide can be used in wafer level packaging (WLP) and integrated fan-out (InFO) packaging. Under-bump metallization (UBM) can be formed on a polyimide layer, and metal bumps can be electroplated on the UBM. Polyimide can be used as a protective layer and buffer layer because of its heat resistance, thermal expansion, and mechanical properties. With scaling down of semiconductor device sizes, a thicker polyimide protective layer with improved mechanical strength may be required. Due to its high absorption and low penetration, profile control of the polyimide protective layer can be challenging.

The present disclosure provides example semiconductor structures (e.g., WLP structures and InFO structures) with a controlled polyimide profile and a method for forming the controlled polyimide profile. In some embodiments, polyimide is dissolved in a solvent, such as poly(acrylic acid) (PAA) and gamma-butyrolactone (GBL), to form a polyimide photoresist. A polyimide opening can be formed using a photolithographic process. The photolithographic process can be performed by a patterning system. The photolithographic process can include operations, such as spin coating the polyimide photoresist, soft annealing, exposing, post-exposure annealing, developing, and curing (post-develop annealing). By increasing the numerical aperture (NA) during the exposing operation, having a post-exposure annealing operation, having a post-develop annealing operation, and adjusting a cross-linker dosage in the polyimide photoresist, the polyimide opening can have a slanted (e.g., wider at the top and narrower at the bottom) profile. Compared with a substantially vertical profile, a slanted polyimide opening can increase UBM adhesion and coverage. An improved UBM adhesion and coverage can increase step coverage of metal bump deposition/electroplating, improving uniformity in metal bump formation across a wafer. A slanted polyimide opening can reduce delamination defects, thus increasing reliability and life of the WLP and InFO structures.

According to some embodiments, FIG. 1A illustrates a cross-sectional view of a semiconductor structure 100. In some embodiments, semiconductor structure 100 can represent a WLP structure 100 or an InFO structure 100. Semiconductor structure 100 can include a substrate 102, a dielectric layer 104, a top metallization (TME) 106, a dielectric layer 108, a dielectric layer 110, a metal-insulator-metal (MIM) structure 112, a redistribution layer (RDL) 114, a dielectric layer 116, a polyimide layer 118, a UBM 120, a metal bump 122, and a solder 124.

Substrate 102 can be a semiconductor material, such as silicon (Si), germanium (Ge), silicon germanium (SiGe), a silicon-on-insulator (SOI) structure, and a combination thereof. Further, substrate 102 can be doped with p-type dopants (e.g., boron (B), indium (In), aluminum (Al), or gallium (Ga)) or n-type dopants (e.g., phosphorus (P) or arsenic (As)). Substrate 102 can include transistor structures, such as field-effect transistors (FETs), planar FETs, finFETs, and gate-all-around (GAA) FETs. The FETs can include gate structures and source/drain (S/D) regions. Substrate 102 can further include interconnects, such as metal lines and vias.

Dielectric layer 104, 108, 110, and 116 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$). Dielectric layer 104, 108, 110, and 116 can be an interlayer dielectric (ILD). Dielectric layer 108, 110, and 116 can be a passivation layer. Dielectric layer 104 can be formed on substrate 102. Dielectric layer 108 can be formed on dielectric layer 104. Dielectric layer 110 can be formed within dielectric layer 108. In some embodiments, dielectric layer 110 can be titanium nitride (TiN) having a thickness of about 40 nm. Dielectric layer 116 can be formed on RDL 114. Thickness T3 of dielectric layer 116 can be between about 2 μm and about 3 μm.

TME 106 can be interconnects, such as metal lines and vias. TME 106 can also be transistor contacts, such as gate contacts and S/D contacts. TME 106 can include a suitable conductive material, such as tungsten (W), titanium (Ti), silver (Ag), ruthenium (Ru), molybdenum (Mo), copper (Cu), cobalt (Co), Al, iridium (Ir), nickel (Ni), metal alloys, and a combination thereof. TME 106 can be formed on substrate 102 and within dielectric layer 104. Semiconductor structure 100 can include additional layers of dielectric layer 104 and TME 106.

Referring to FIGS. 1A and 1E, MIM structure 112 can include an insulating layer 132 interposed between two conductive layers 130. In some embodiments, insulating layer 132 can be aluminum oxide ($Al_2O_3$) having a thickness of about 2 nm. In some embodiments, conductive layers 130 can be the same material and can be a metal oxide, such as zirconium oxide ($ZrO_2$), having a thickness of about 2 nm. In some embodiments, conductive layers 130 can be different conductive materials, such as two metals, two metal oxides, and one metal and one metal oxide. MIM structure 112 can be formed within dielectric layer 110. MIM structure 112 can also be formed within dielectric layer 108 and dielectric layer 110.

Referring to FIG. 1A, RDL 114 can include a suitable conductive material similar to that of TME 106. In some embodiments, RDL 114 can include Al. A bottom surface of RDL 114 can be in contact with TME 106. RDL 114 can be formed on dielectric layer 108 and portions of RDL 114 can be through dielectric layer 108 and dielectric layer 110. Thickness T2 of the portion of RDL 114 above dielectric layer 108 can be between about 2 μm and about 3 μm. Distance L1 between adjacent RDLs 114 can be at least about 6 μm.

Polyimide layer 118 can include polyimide and can be formed on dielectric layer 116. Portions of polyimide layer 118 can be in contact with a top surface of RDL 114. Referring to FIGS. 1A and 1B, the slanted profile of region 126 can have angle 1 at or near a top portion of region 126, angle 2 at or near a middle portion of region 126, and angle 3 at or near a bottom portion of region 126. Angle 1 can be between about 40 degrees and about 85 degrees, between about 50 degrees and about 75 degrees, and between about 60 degrees and about 65 degrees. Angle 2 can be between about 40 degrees and about 90 degrees, between about 50 degrees and about 80 degrees, and between about 60 degrees and about 70 degrees. Angle 3 can be between about 40 degrees and about 90 degrees, between about 50 degrees and about 80 degrees, and between about 60 degrees and about 70 degrees. The ranges of angles 1, 2, 3 can result in a slanted profile of region 126 of polyimide layer 118 for improved UBM adhesion. If angles 1, 2, and 3 are below about 40 degrees, region 126 becomes relatively flat and UBM adhesion may be insufficient. For example, if the UBM coverage of region 128 of polyimide layer 118 is below about 80%, the UBM adhesion can be considered insufficient. If angle 1 is above about 85 degrees and angles 2 and 3 are above about 90 degrees, region 126 becomes substantially vertical and UBM adhesion may be insufficient. If the UBM coverage of region 128 of polyimide layer 118 is below about 80%, the UBM adhesion can be considered insufficient. Insufficient UBM adhesion can lead to delamination of UBM and metal bumps and cause reliability deterioration. Angles 1, 2, and 3 can be controlled by process parameters, such as cross-linker dosage, NA used during exposing, post-exposure annealing, and post-develop annealing.

Referring to FIG. 1A, thickness T4 of polyimide layer 118 above dielectric layer 116 can be between about 3 μm and about 9 μm, between about 4 μm and about 8 μm, and between about 5 μm and about 7 μm. This range of thickness T4 combined with process parameters can result in desired ranges for angles 1, 2, and 3.

Figure 1C:
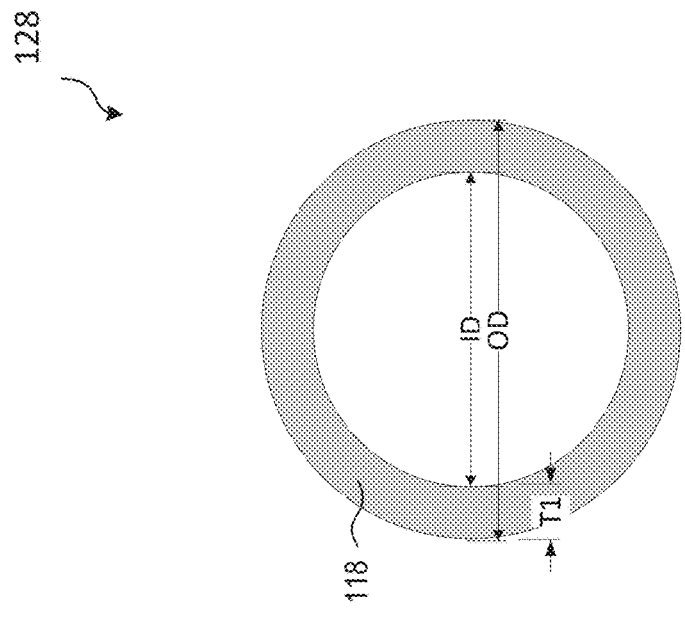
Figure 1B:
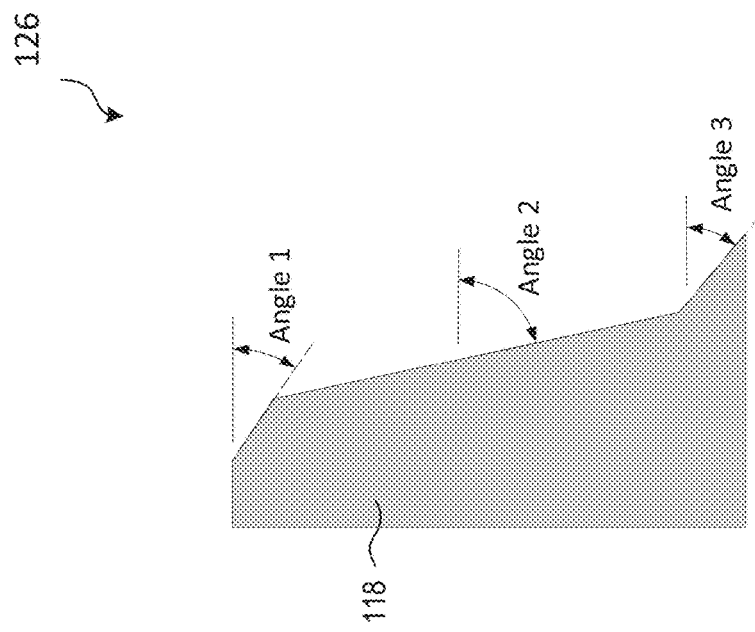
FIG. 1B illustrates a cross-sectional view of a portion of a polyimide layer, in accordance with some embodiments.

Referring to FIGS. 1A, 1C, and 1D, region 128 viewed from the top can have a circular or elliptical shape. Other shapes are possible, such as rectangular, square, diamond, and trapezoidal shapes. Distance D1 can be inner diameter ID in the circular shape or inner minor axis SA2 in the elliptical shape. In the circular shape shown in FIG. 1C, ID can be between about 5 μm and about 30 μm, between about 8 μm and about 27 μm, and between about 10 μm and about 25 μm. Outer diameter OD can be between about 7 μm and about 35 μm, between about 10 μm and about 32 μm, and between about 12 μm and about 30 μm. If ID is smaller than about 5 μm or OD is smaller than about 7 μm, the size of region 128 can be too small for the UBM, the metal bumps, and the solder. If ID is greater than about 30 µm or OD is greater than about 35 µm, the number of metal bumps across the wafer can be too small. The ratio between OD and ID can be between about 1.05 and about 3.15, between about 1.1 and about 3.1, and between about 1.2 and about 3. If the ratio between OD and ID is smaller than about 1.05, region 128 cannot support the UBM mechanically. If the ratio between OD and ID is greater than about 3.15, the number of metal bumps across the wafer can be too small.

In the elliptical shape shown in FIG. 1D, SA2 can be between about 5 µm and about 30 µm, between about 8 µm and about 27 µm, and between about 10 µm and about 25 µm. Outer minor axis SA1 can be between about 7 µm and about 35 µm, between about 10 µm and about 32 µm, and between about 12 µm and about 30 µm. Inner major axis LA2 can be between about 15 µm and about 35 µm, between about 18 µm and about 32 µm, and between about 20 µm and about 30 µm. Outer major axis LA1 can be between about 17 µm and about 40 µm, between about 20 µm and about 37 µm, and between about 22 µm and about 35 µm. If SA2 is smaller than about 5 µm, SA1 is smaller than about 7 µm, LA2 is smaller than about 15 µm, or LA1 is smaller than about 17 µm, the size of region 128 can be too small for the UBM, the metal bumps, and the solder. If SA2 is greater than about 30 µm, SA1 or LA2 is greater than about 35 µm, or LA1 is greater than about 40 µm, the number of metal bumps across the wafer can be too small. The ratio between SA1 and SA2 can be between about 1.05 and about 3.15, between about 1.1 and about 3.1, and between about 1.2 and about 3. The ratio between LA1 and LA2 can be between about 1.05 and about 1.8, between about 1.07 and about 1.78, and between about 1.1 and about 1.75. If the ratio between SA1 and SA2 or the ratio between LA1 and LA2 is smaller than about 1.05, region 128 cannot support the UBM mechanically. If the ratio between SA1 and SA2 is greater than about 3.15 or the ratio between LA1 and LA2 is greater than about 1.8, the number of metal bumps across the wafer can be too small. The ratio between LA1 and SA1 can be between about 1.6 and about 3.2, between about 1.7 and about 3.1, and between about 1.8 and about 3. The ratio between LA2 and SA2 can be between about 1.8 and about 3.2, between about 1.9 and about 3.1, and between about 2 and about 3. If the ratio between LA1 and SA1 is smaller than about 1.6 or the ratio between LA2 and SA2 is smaller than about 1.8, region 128 cannot achieve the desired elongated shape. If the ratio between LA1 and SA1 or the ratio between LA2 and SA2 is greater than about 3.2, the elongated shape of region 128 can lead to challenges in the fabrication process. Even though FIG. 1D shows the major axis in Y-direction and the minor axis in X-direction, a rotation of 90 degrees is possible. Namely, the major axis can be in X-direction, and the minor axis can be in Y-direction.

Thickness T1 of sidewalls of region 128 of polyimide layer 118 depends on ID and OD in the circular shape. T1 can be between about 0.8 µm and about 2.7 µm, between about 0.9 µm and about 2.6 µm, and between about 1 µm and about 2.5 µm. In the elliptical shape, thickness T2 of sidewalls in the minor axis depends on SA1 and SA2. T2 can be can be between about 0.8 µm and about 2.7 µm, between about 0.9 µm and about 2.6 µm, and between about 1 µm and about 2.5 µm. If T1 or T2 is smaller than about 0.8 µm, region 128 cannot support the UBM mechanically. If T1 or T2 is greater than about 2.7 µm, the number of metal bumps across the wafer can be too small. In the elliptical shape, thickness T3 of sidewalls in the major axis depends on LA1 and LA2. In some embodiments, T3 can be different from T2. For example, the ratio between T2 and T3 can be between about 1.2 and about 2, between about 1.25 and about 1.8, and between about 1.3 and about 1.5. If the ratio between T2 and T3 is smaller than about 1.2, region 128 cannot support the UBM mechanically. If the ratio between T2 and T3 is greater than about 2, the number of metal bumps across the wafer can be too small. Distance L2 between outer sidewalls of adjacent regions 128 can be at least about 7 µm, at least about 8 µm, at least about 9 µm. Distance L3 between inner sidewalls of adjacent regions 128 can be at least about 10 µm, at least about 11 µm, at least about 12 µm. If L2 is smaller than about 7 µm or L3 is smaller than about 10 µm, regions 128 can be too close to each other and lead to challenges in the fabrication process. Generally, these dimension ranges and ratios of region 128 provide an optimal adhesion for UBM without compromising device size and manufacturing cost.

Referring to FIG. 1A, UBM 120 can include a conductive material similar to that of TME 106 and RDL 114. In some embodiments, UBM 120 can include Ti, Cu, or Ti/Cu alloy. UBM 120 can be formed on region 128 of polyimide layer 118. A portion of UBM 120 can be in contact with a top surface of RDL 114. Namely, UBM 120 is electrically coupled to TME 106 by RDL 114. Thickness T5 of UBM 120 above polyimide layer 118 can be between about 1 µm and about 4 µm. UBM 120 can improve adhesion of metal bump 122, thus improving uniformity of forming metal bumps across a wafer in bumping processes.

Metal bump 122 can include a conductive material similar to that of TME 106, RDL 114, and UBM 120. In some embodiments, metal bump 122 can include Cu. Metal bump 122 can be formed on UBM 120. Thickness T6 of metal bump 122 above UBM 120 can be between about 20 µm and about 45 µm. Solder 124 can include a soldering material, such as tin (Sn). Solder 124 can be formed on metal bump 122. Thickness T7 of solder 124 above metal bump 122 can be about 20 µm. Diameter D2 of metal bump 122 and solder 124 can be between about 20 µm and about 50 µm. Bump space L4 between adjacent metal bumps 122 can be between about 5 µm and about 30 µm. Bump pitch L5 between adjacent bumps 122 can be between about 25 µm and about 80 µm. In some embodiments, there can be between about 7000 and about 40000 metal bumps 122 on a wafer.

Figure 2:
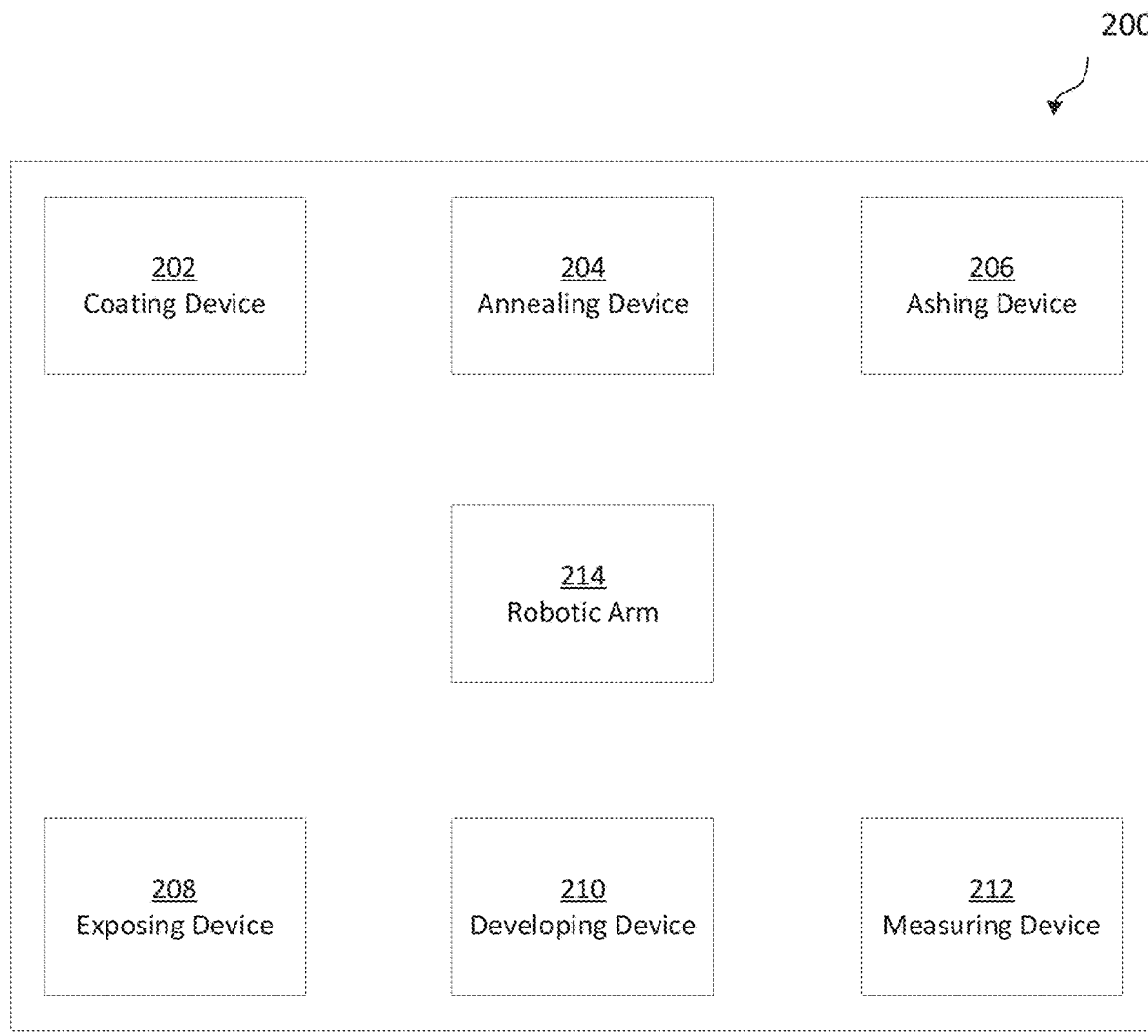
FIG. 2 is a diagram of a patterning system, in accordance with some embodiments.

According to some embodiments, FIG. 2 is a diagram of a patterning system 200. Patterning system 200 can include a coating device 202, an annealing device 204, an ashing device 206, an exposing device 208, a developing device 210, a measuring device 212, and a robotic arm 214. Patterning system 200 can have more or fewer devices than the above-listed devices. Patterning system 200 can be used to perform various operations of method 300 in FIG. 3 described below.

Coating device 202 can spin coat a polymer, such as a photoresist, on a substrate, such as a wafer. The photoresist can be supplied by a chemical supply system. A controlled amount of photoresist can be dispensed onto each wafer. Coating device 202 can include a substrate holder, and the substrate holder can rotate at a revolutions per minute (RPM) between about 50 and about 5000, according to some embodiments. The RPM may be lower during start up and slow down than at a steady peak speed. Coating device 202 can securely attach the wafer onto the substrate holder by a vacuum suction mechanism such that the wafer can stay on the substrate holder while the wafer spins with the substrate holder.

Annealing device 204 can anneal the wafer at various stages. For example, there can be a soft annealing after the photoresist is spin coated on the wafer by coating device 202. There can be a post-exposure annealing after the photoresist is exposed to a radiation source by exposing device 208. There can be a curing (post-develop annealing) after the exposed photoresist is developed by developing device 210. Annealing device 204 can include a heating plate. Annealing device 204 can anneal the wafer between about 30 degrees Celsius and about 350 degrees Celsius. Annealing time can vary based on different annealing needs at various stages, for example, between about 20 seconds and about 5 hours. Annealing device 204 can include a vacuum suction mechanism such that the wafer can be secured on the heating plate during annealing. Annealing device 204 can include a wafer support mechanism such that the wafer can be suspended in air to cool in room temperature (e.g., between about 20 degrees Celsius and about 22 degrees Celsius). Additionally and/or alternatively, annealing device 204 can include an oven and the oven can anneal multiple wafers at one time.

Ashing device 206 can remove the remaining photoresist after a photoresist pattern is transferred by operations, such as deposition and etching (e.g., stripping the remaining photoresist). Ashing device 206 can also clean the opened areas of the patterned photoresist after post-develop annealing, namely increasing the definition of the photoresist pattern. In some embodiments, ashing device 206 can reduce the thickness of the photoresist layer after post-develop annealing, namely tuning the thickness of the photoresist layer. Ashing device 206 can use a plasma gas, such as oxygen ($O_2$), to bombard the photoresist to achieve stripping, improved definition, or tuning. Ashing device 206 can perform ashing between about 100 degrees Celsius and about 400 degrees Celsius. Ashing time can vary based on different ashing needs, for example, between about 2 seconds and about 60 seconds. Ashing device 206 can include a wafer holder, and the wafer holder can hold multiple wafers. Ashing device 206 can be a stand-alone device.

Exposing device 208 can expose the photoresist to a radiation source. The radiation source can be an ultraviolet (UV), extreme ultraviolet (EUV), or deep ultraviolet (DUV) source with different wavelengths, such as about 193 nm. Exposing device 208 can have a radiation energy range between about 50 mJ and about 800 mJ. Exposing device 208 can have an NA range between about 0.3 and about 0.8. Exposing device 208 can have a focus range between about −1.5 μm and about 1.5 μm. Combinations of these parameters can result in different exposure results. Exposing device 208 can include wafer loading ports to receive and return wafers. Exposing device 208 can include a reticle (e.g., a photomask) loading port. The photomask can include photomask patterns that define sizes, shapes, and relative locations of the photoresist patterns. The photomask patterns can be transferred to the photoresist during an exposure process. Transferring the photomask patterns can be performed in multiple operations, such as exposing the wafer area by area until the entire wafer is exposed. Before exposing, the photomask can be aligned to one or more markers on the wafer such that the photomask patterns are transferred to the corresponding locations on the wafer. Exposing device 208 can have additional technologies, such as immersion photolithography, to enhance resolution of the photoresist patterns. Exposing device 208 can be a stand-alone device.

Developing device 210 can remove the exposed (e.g., for positive photoresist) or unexposed (e.g., for negative photoresist) portions of the photoresist. The removal can be done by a developing chemical, such as tetramethylammoniumhydroxide (TMAH) and cyclopentanone ($C_5H_8O$). The developing chemical can be a mix of one or more chemicals. Developing device 210 can include a substrate holder and a vacuum suction mechanism to secure the wafer onto the substrate holder. The developing chemical can then be dispensed on the wafer by a chemical supply system. A controlled amount of the developing chemical can be dispensed on the wafer. After some controlled time, for example, between about 5 seconds and about 120 seconds, the substrate holder can spin off the remaining developing chemical. More than one developing chemical can be dispensed on the wafer based on a developing schedule to fully develop the wafer. In some embodiments, deionized water can be dispensed on the wafer after one or more developing chemicals are dispensed on the wafer. Deionized water can be used to rinse off the residue developing chemicals on the wafer. Additionally and/or alternatively, developing device 210 can include one or more developing tanks. Each developing tank can contain a controlled amount of one developing chemical. In some embodiments, developing device 210 can include a wafer holder, and the wafer holder can hold multiple wafers. The multiple wafers can be fully immersed in the developing chemical in one tank. After a controlled amount of time, for example, between about 5 seconds and about 120 seconds, the multiple wafers can be lifted out of the developing tank. The multiple wafers can be fully immersed in additional tanks based on a developing schedule. In some embodiments, the multiple wafers can be loaded in a spin dry device to spin off the developing chemicals. Deionized water can be dispensed during spin drying to further rinse off the developing chemicals. Developing device 210 with developing tanks can be a stand-alone device.

Measuring device 212 can measure a critical dimension (CD) of the opened areas of the patterned photoresist. Measuring device 212 can be an optical metrology device or a scanning electron microscopy (SEM). Measuring device 212 can include a wafer loading port to receive and return wafers. One or more sites can be measured across the wafer by measuring device 212. Multiple measurement sites can provide CD uniformity information across the wafer. The CD must be within a specified range according to a specific device requirement or technology requirement, according to some embodiments. If the CD is out of the specified range, based on the CD measured on a previous batch of wafers, photolithography process parameters can be adjusted accordingly to achieve desired CD on a following batch of wafers. Measuring device 212 can be a stand-alone device.

Robotic arm 214 can move the wafer between different devices, such as coating device 202, annealing device 204, ashing device 206, exposing device 208, developing device 210, and measuring device 212. Robotic arm 214 can have multiple degrees of freedom. Robotic arm 214 can include a vacuum suction mechanism such that the wafer can be secured on robotic arm 214 during transfers between different devices. In some embodiments, a time scheduled for a wafer on a specific device can be between when robotic arm 214 delivers the wafer to the specific device and when robotic arm 214 picks up the wafer from the specific device. Robotic arm 214 can be controlled by a computer system (not shown in FIG. 2). The computer system can include program code (e.g., a recipe) that controls robotic arm 214 to perform motion functions. The program code can also control conditions of different devices and durations of a wafer on different devices.

Figure 3:
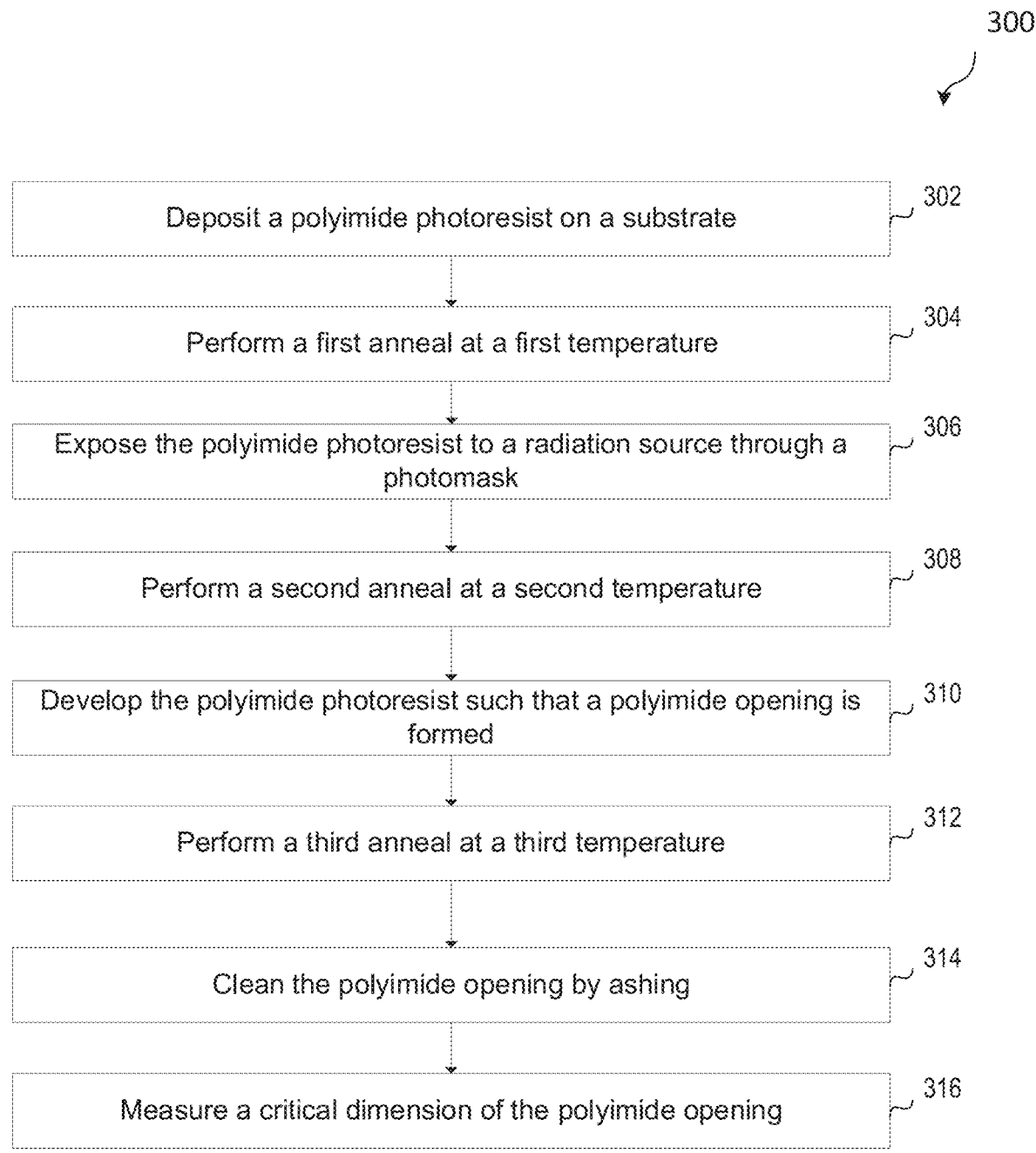
FIG. 3 is a flow diagram of a method for fabricating a semiconductor structure with a polyimide layer, in accordance with some embodiments.
Figure 9:
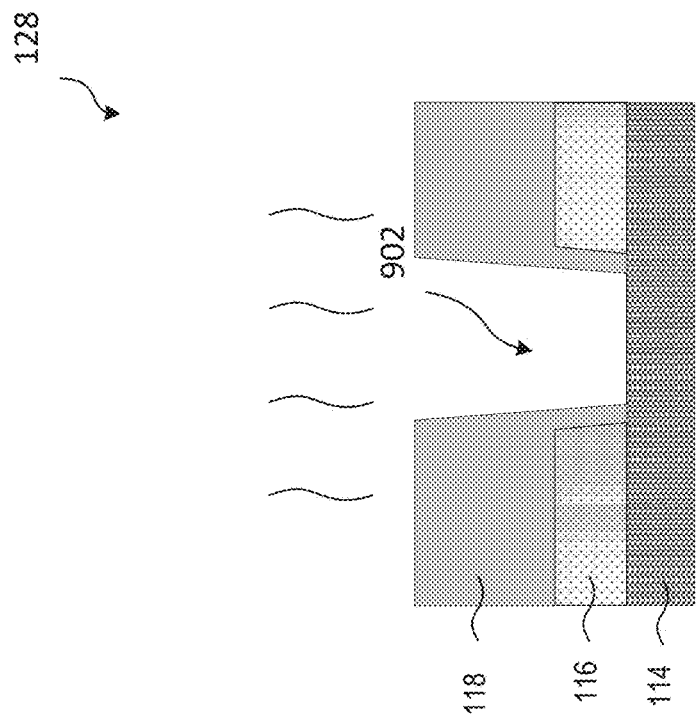
Figure 10B:
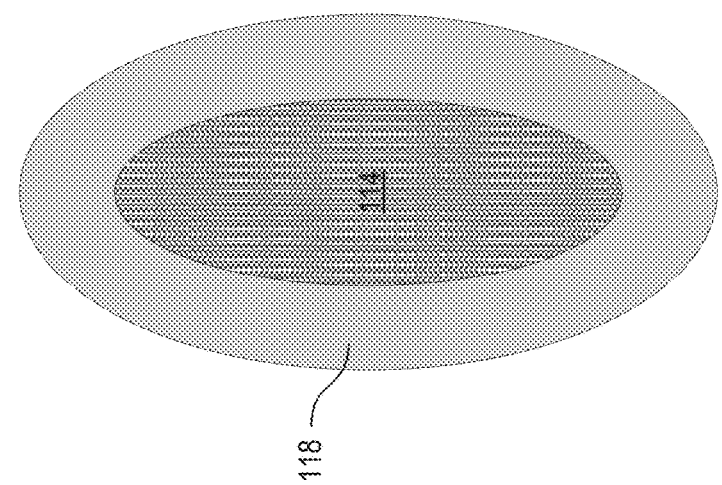
FIGS. 10A and 10B illustrate top views of a portion of a polyimide layer, in accordance with some embodiments.
Figure 10A:
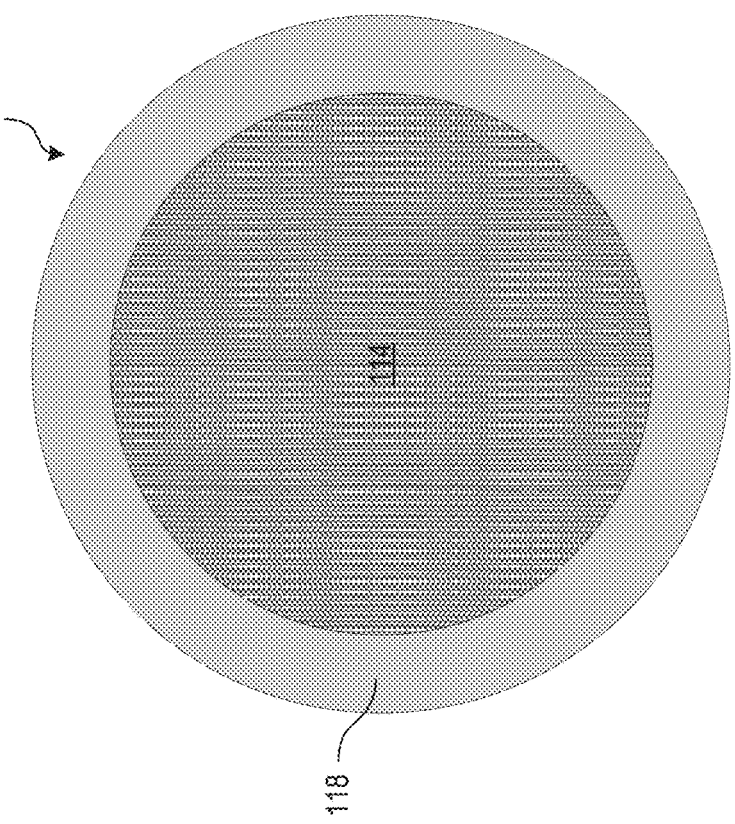

According to some embodiments, FIG. 3 is a flow diagram of a method 300 for fabricating a semiconductor structure 100 as shown in FIG. 1A. For illustrative purposes, the operations illustrated in FIG. 3 will be described with reference to the example fabrication process for fabricating semiconductor structure 100 as illustrated in FIGS. 4-9, 10A, and 10B. FIGS. 4-9 are enlarged views of region 128 in FIG. 1A. FIGS. 10A and 10B are top views of region 128 in FIG. 1A. Additional fabrication operations can be performed between the various operations of method 300 and can be omitted for simplicity. These additional fabrication operations are within the spirit and the scope of this disclosure. Moreover, not all operations may be required to perform the disclosure provided herein. Additionally, some of the operations can be performed simultaneously, or in a different order than the ones shown in FIG. 3. Elements in FIGS. 4-9, 10A, and 10B with the same annotations as elements in FIG. 1A are described above.

It should be noted that method 300 may not produce a complete semiconductor structure 100. Accordingly, it is understood that additional processes can be provided before, during, and after method 300, and that some other processes may only be briefly described herein. For example, dielectric layer 104, 108, 110, and 116 can be deposited by physical vapor deposition (PVD) or chemical vapor deposition (CVD). TME 106, RDL 114, and UBM 120 can be formed by CVD, plasma-enhanced chemical vapor deposition (PECVD), metal-organic chemical vapor deposition (MOCVD), PVD, or sputtering. MIM structure 112 can be formed by atomic layer deposition (ALD). Metal bump 122 can be formed by PVD, sputtering, or electroplating. Solder 124 can be formed by soldering.

Figure 4:
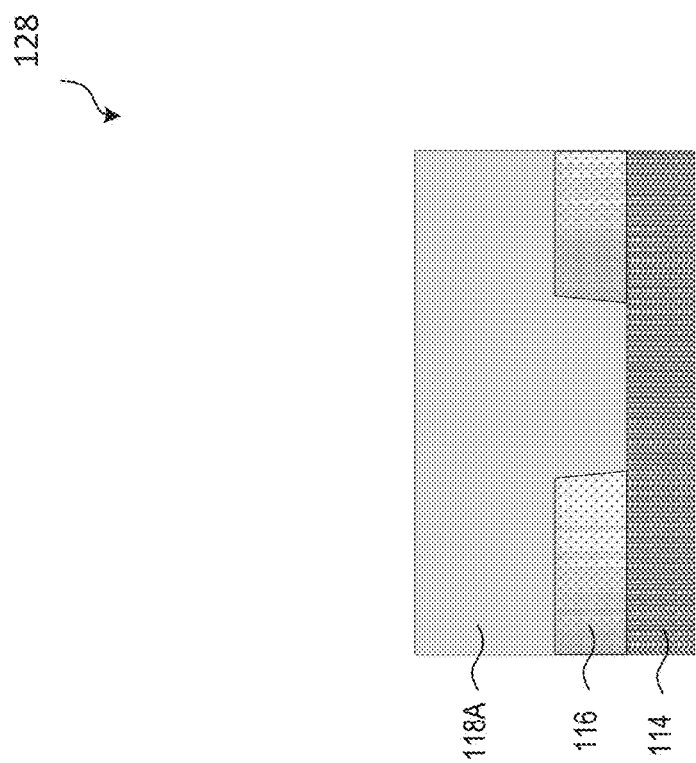

Referring to FIG. 3, in operation 302, a polyimide photoresist is deposited on a substrate. For example, as shown in FIG. 4, polyimide photoresist 118A is deposited on dielectric layer 116 and RDL 114. Dielectric layer 116 can include an opening. The opening can be formed by dry etch or wet etch. Polyimide photoresist 118A can be spin coated on dielectric layer 116 and RDL 114 by coating device 202 of FIG. 2. The spin coating RPM can be between about 800 and about 1600. The RPM range is necessary to deposit an optimal thickness of polyimide photoresist 118A on dielectric layer 116 and RDL 114. The thickness of polyimide photoresist 118A can be between about 8 μm and about 12 μm, between about 8.5 μm and about 11.5 μm, and between about 9 μm and about 11 μm. Polyimide photoresist 118A can include polyimide and a solvent, such as PAA and GBL. The mixing ratio between polyimide and the solvent can be between about 6% and about 44%, between about 8% and about 42%, and between about 10% and about 40%. The mixing ratio range between polyimide and the solvent can provide a fluidic polyimide photoresist 118A suitable for spin coating. If the mixing ratio between polyimide and the solvent is below about 6%, the resulting polyimide layer can be too thin and cannot form a slanted profile. If the mixing ratio between polyimide and the solvent is above about 44%, polyimide layer thickness non-uniformity can be too great.

Polyimide photoresist 118A can include additional chemicals, such as a cross-linker (with a mixing ratio between about 0.8% and about 2.2%, between about 0.9% and about 2.1%, and between about 1% and about 2%), a photo initiator (with a mixing ratio between about 0.1% and about 2%, between about 0.3% and about 1.5%, and between about 0.5% and about 1%), and an inhibitor (with a mixing ratio between about 0.8% and about 2.2%, between about 0.9% and about 2.1%, and between about 1% and about 2%). The mixing ratio ranges of the cross-linker, the photo initiator, and the inhibitor can provide a polyimide photoresist 118A suitable for exposing and developing. If the mixing ratio between the cross-linker and the polyimide photoresist is below about 0.8%, the mixing ratio between the photo initiator and the polyimide photoresist is below about 0.1%, or the mixing ratio between the inhibitor and the polyimide photoresist is below about 0.8%, the resulting polyimide layer can be too thin and cannot form a slanted profile. If the mixing ratio between the cross-linker and the polyimide photoresist is above about 2.2%, the mixing ratio between the photo initiator and the polyimide photoresist is above about 2%, or the mixing ratio between the inhibitor and the polyimide photoresist is above about 2.2%, polyimide layer thickness non-uniformity can be too great. A higher dosage of the cross-linker within the acceptable mixing ratio range of the cross-linker can result in a more slanted polyimide profile. For example, referring to FIG. 1B, changing a cross-linker dosage from about 1% to about 2% can reduce angle 2 between about 1 degree and about 12 degrees, between about 1.5 degrees and about 11 degrees, and between about 2 degrees and about 10 degrees. A slanted (e.g., wider at the top and narrower at the bottom) polyimide profile is beneficial for UBM and metal bump adhesion.

Figure 5:
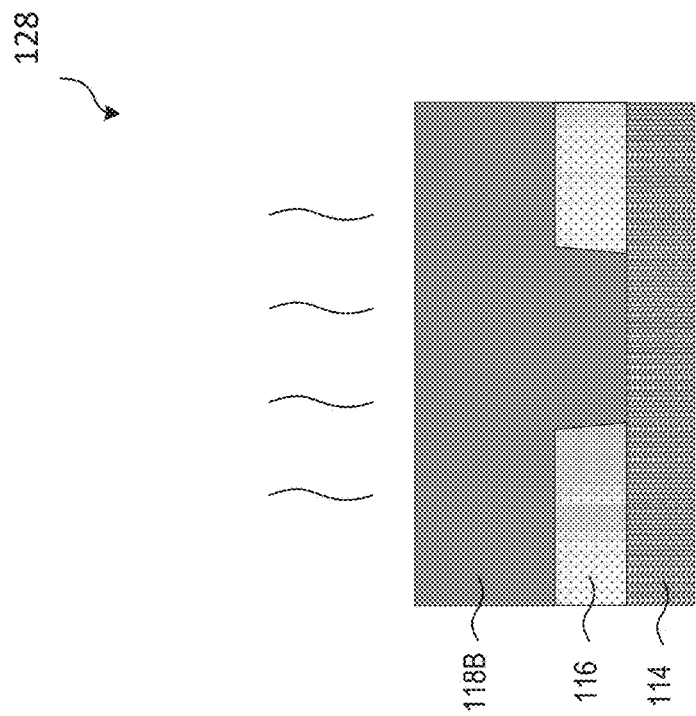
FIGS. 4-9 illustrate cross-sectional views of a semiconductor structure with a polyimide layer at various stages of its fabrication process, in accordance with some embodiments.

Referring to FIG. 3, in operation 304, the substrate with the polyimide photoresist can be annealed at a first temperature (e.g., soft annealing). For example, as shown in FIG. 5, polyimide photoresist 118B, dielectric layer 116, and RDL 114 can be annealed at a temperature between about 50 degrees Celsius and about 200 degrees Celsius. Polyimide photoresist 118B, dielectric layer 116, and RDL 114 can be annealed at the above-described temperatures for a time between about 150 seconds and about 350 seconds. Polyimide photoresist 118B, dielectric layer 116, and RDL 114 can be annealed at the above-described temperatures for the above-described durations by annealing device 204 of FIG. 2. The above-described temperature ranges and the above-described duration ranges can ensure optimal slanting angles in the polyimide layer.

Figure 6:
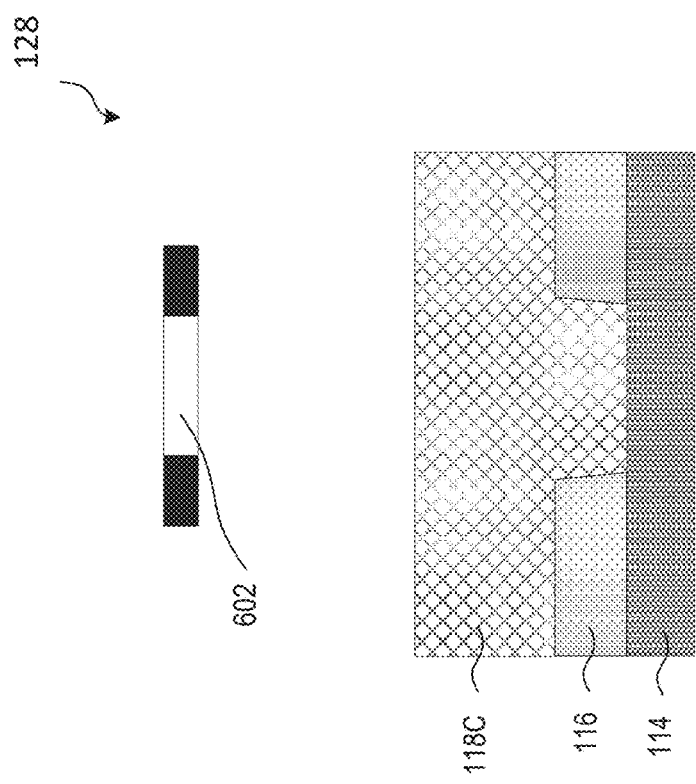

Referring to FIG. 3, in operation 306, the polyimide photoresist can be exposed to a radiation source through a photomask. For example, as shown in FIG. 6, polyimide photoresist 118C can be exposed to a radiation source, such as a UV, EUV, and DUV radiation source, through photomask 602. Photomask 602 can have patterns that are associated with shapes, sizes, and locations of polyimide openings to be formed in polyimide photoresist 118C. The exposing can be performed by exposing device 208 of FIG. 2. The exposing can be performed with a focus between about −2 μm and about 2 μm. The exposing can be performed with an energy between about 150 mJ and about 550 mJ. If the energy is below 180 mJ, polyimide photoresist 118C may not be completely exposed and may have residue after develop. If the energy is above 520 mJ, polyimide opening CD may be above an upper limit of the specified range. The exposing can be performed with an NA between about 0.2 and about 1. A higher NA within the acceptable range can result in a more slanted polyimide profile. For example, referring to FIG. 1B, changing the NA from about 0.5 to about 0.64 can reduce angle 1 between about 1 degree and about 8 degrees, between about 1 degree and about 7 degrees, and between about 1 degree and about 6 degrees. The above-described ranges for energy, focus, and NA can ensure optimal slanting angles in the polyimide layer.

Figure 7:
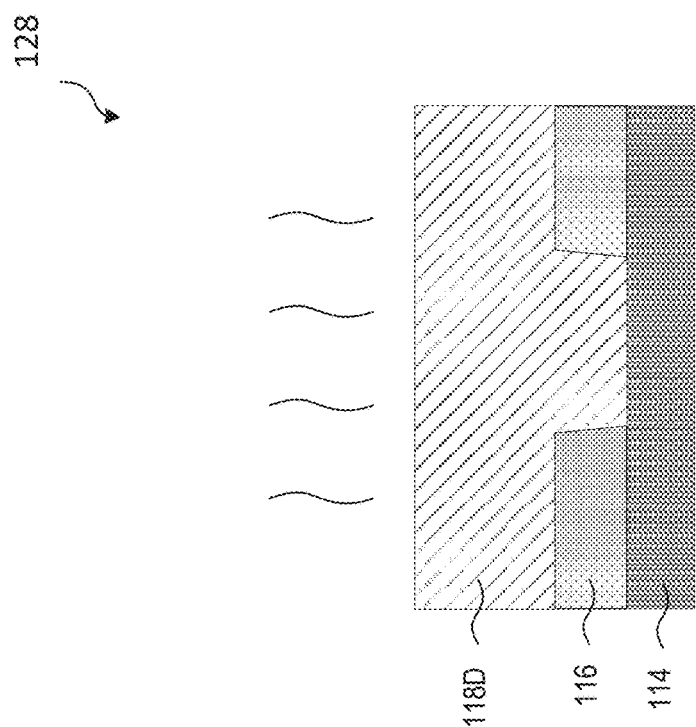

Referring to FIG. 3, in operation 308, the substrate with the polyimide photoresist can be annealed at a second temperature (e.g., post-exposure annealing). For example, as shown in FIG. 7, polyimide photoresist 118D, dielectric layer 116, and RDL 114 can be annealed at a temperature between about 50 degrees Celsius and about 200 degrees Celsius. Polyimide photoresist 118D, dielectric layer 116, and RDL 114 can be annealed at the above-described temperatures for a time between about 25 seconds and about 200 seconds. Polyimide photoresist 118D, dielectric layer 116, and RDL 114 can be annealed at the above-described temperatures for the above-described durations by annealing device 204 of FIG. 2. Polyimide photoresist 118D, dielectric layer 116, and RDL 114 can then be cooled at room temperature (e.g., between about degrees Celsius and about 22 degrees Celsius) for a time between about 5 seconds and about 150 seconds.

Post-exposure annealing can result in a more slanted polyimide profile. For example, referring to FIG. 1B, compared with a process without post-exposure annealing, the process with post-exposure annealing can reduce angle 2 between about 5 degree and about 15 degrees, between about 6 degree and about 14 degrees, and between about 7 degree and about 13 degrees. A slanted (e.g., wider at the top and narrower at the bottom) polyimide profile is beneficial for UBM and metal bump adhesion. To ensure post-exposure annealing fully takes effect, there can be a wait time between about 2 hours and about 10 hours before develop. The above-described ranges for annealing temperature, annealing time, cooling time, and wait time can ensure optimal slanting angles in the polyimide layer.

Figure 8:
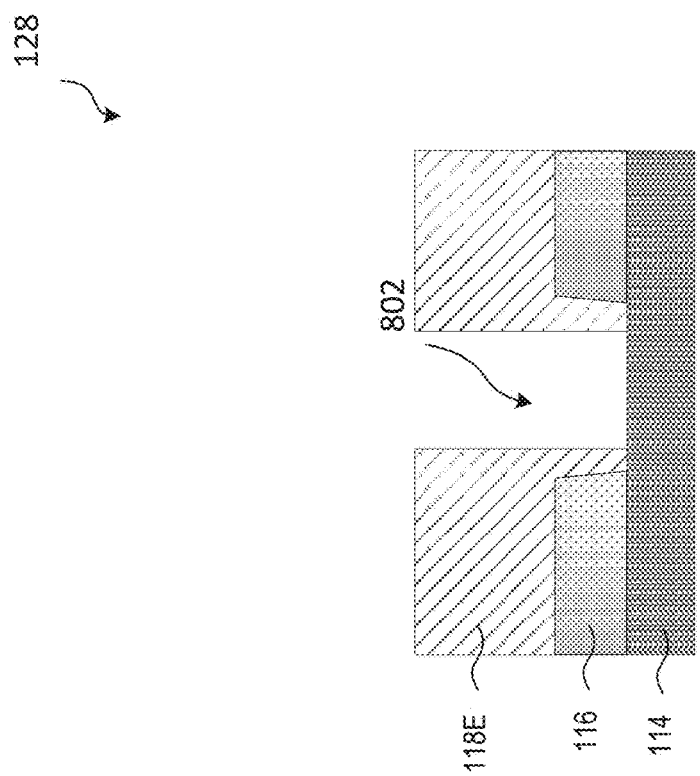

Referring to FIG. 3, in operation 310, the polyimide photoresist can be developed such that a polyimide opening is formed. For example, as shown in FIG. 8, polyimide photoresist 118E can be developed such that polyimide opening 802 can be formed. Exposed (e.g., for positive photoresist) or unexposed (e.g., for negative photoresist) portions of polyimide photoresist 118E can be removed by a developing chemical. The developing chemical can be $C_5H_8O$. Developing time can be between about 5 seconds and about 200 seconds. If the developing time is too short, polyimide opening 802 may not be completely developed and may have residue after develop. If the developing time is too long, polyimide opening 802 CD may be above an upper limit of the specified range. Polyimide photoresist 118E can be developed with the above-described developing chemicals for the above-described durations by developing device 210 of FIG. 2. The above-described duration ranges can ensure optimal slanting angles in the polyimide layer.

Referring to FIG. 3, in operation 312, the substrate with the polyimide photoresist can be annealed at a third temperature (e.g., curing or post-develop annealing). For example, as shown in FIG. 9, polyimide layer 118, dielectric layer 116, and RDL 114 can be annealed at a temperature between about 200 degrees Celsius and about 400 degrees Celsius. Polyimide layer 118, dielectric layer 116, and RDL 114 can be annealed at the above-described temperatures for a time between about 2 hours and about 8 hours. Polyimide layer 118, dielectric layer 116, and RDL 114 can be annealed at the above-described temperatures for the above-described durations by annealing device 204 of FIG. 2. Post-develop annealing can result in a more slanted polyimide opening 902. For example, referring to FIG. 1B, compared with a process without post-develop annealing, the process with post-develop annealing can reduce angle 1 between about 1 degree and about 8 degrees, between about 1 degree and about 7 degrees, and between about 2 degrees and about 6 degrees. A slanted (e.g., wider at the top and narrower at the bottom) polyimide profile is beneficial for UBM and metal bump adhesion. The above-described ranges for temperature and duration can ensure optimal slanting angles in the polyimide layer.

Referring to FIG. 3, in operation 314, the polyimide opening can be cleaned by ashing, namely residue in the polyimide opening can be removed. For example, residue in polyimide opening 902 can be removed with an $O_2$ plasma at a temperature between about 200 degrees Celsius and about 400 degrees Celsius. Residue in polyimide opening 902 can be removed with an $O_2$ plasma at the above-described temperatures for a time between about 2 seconds and about 100 seconds. Residue in polyimide opening 902 can be removed with an $O_2$ plasma at the above-described temperatures for the above-described durations by ashing device 206 of FIG. 2. Ashing can also tune the thickness of polyimide layer 118 to be in a specified range. In other words, ashing can remove some thickness of polyimide layer 118 such that the thickness of polyimide layer 118 can be in the specified range. The above-described ranges for temperature and duration can ensure optimal slanting angles and optimal thickness in the polyimide layer.

Referring to FIG. 3, in operation 316, a CD of the polyimide opening can be measured. For example, ID, OD, SA1, SA2, LA1, and LA2 of polyimide opening 902 can be measured by measuring device 212 of FIG. 2. The CD must be within a specified range, according to some embodiments. If the CD is out of the specified range, based on the CD measured on a previous batch of wafers, photolithography process parameters can be adjusted accordingly to achieve desired CD on a following batch of wafers. The CD measurement by measuring device 212 is not invasive and can be in-line. In other words, the CD measurement can be performed on production wafers without damaging the wafers and the production wafers can continue to next operations. In some embodiments, referring to FIG. 1B, angles 1, 2, and 3 can be measured by cutting polyimide opening 902 in a cross-section. The angles measured can be used to control the polyimide profile. The angle measurement can be invasive and not in-line. In other words, a sample wafer can be obtained from production wafers or a test wafer can be produced, and the angle measurement can be performed on the sample wafer or the test wafer. The sample wafer and/or the test wafer are not used in subsequent fabrication operations, according to some embodiments.

According to some embodiments, FIGS. 10A and 10B illustrate top views of polyimide opening 902. In some embodiments, as shown in FIG. 10A, polyimide opening 902 can have a circular shape. In some embodiments, as shown in FIG. 10B, polyimide opening 902 can have an elliptical shape. Polyimide opening 902 can have other shapes, such as square, rectangle, diamond, and trapezoid.

The present disclosure provides example semiconductor structures (e.g., semiconductor structure 100) with a controlled polyimide profile and a method (e.g., method 300) for forming such a controlled polyimide profile. Semiconductor structure 100 can be WLP structures or InFO structures. In some embodiments, polyimide is dissolved in a solvent, such as PAA and GBL, to form a polyimide photoresist (e.g., polyimide photoresist 118A). A polyimide opening (e.g., slanted polyimide opening 902) can then be formed using a photolithographic process. The photolithographic process can be performed by a patterning system (e.g., patterning system 200). The photolithographic process can include operations, such as spin coating the polyimide photoresist, soft annealing, exposing, post-exposure annealing, developing, and curing (post-develop annealing). By increasing the NA during exposing, having a post-exposure annealing operation, having a post-develop annealing operation, and adjusting a cross-linker dosage in the polyimide photoresist, the polyimide opening can have a slanted (e.g., wider at the top and narrower at the bottom) profile. Compared with a substantially vertical profile, a slanted polyimide opening can increase UBM adhesion and coverage. Improved UBM adhesion and coverage can increase step coverage of metal bump deposition/electroplating, and result in more uniform metal bump formation across a wafer. Therefore, a slanted polyimide opening can reduce delamination defects and increase reliability of the WLP and InFO structures.

In some embodiments, a method includes depositing, on a substrate, a photoresist containing polyimide and performing a first anneal at a first temperature. The method further includes exposing the photoresist to a radiation source through a photomask having a pattern associated with a shape of a polyimide opening. The method further includes performing a second anneal at a second temperature and removing a portion of the photoresist to form the polyimide opening. The method further includes performing a third anneal at a third temperature and cleaning the polyimide opening by ashing.

In some embodiments, a method includes forming a TME on a substrate and depositing a first dielectric layer on the TME, where a MIM structure is disposed within the first dielectric layer. The method further includes depositing an RDL on and through the first dielectric layer, where a bottom surface of the RDL is in contact with the TME. The method further includes depositing a second dielectric layer on the RDL and removing a portion of the second dielectric layer. The method further includes depositing, on the second dielectric layer, a photoresist containing polyimide and forming a polyimide opening at a location where the portion of the second dielectric layer is removed.

In some embodiments, a structure includes a TME on a semiconductor substrate and a first dielectric layer on the TME, where the first dielectric layer includes a MIM structure and an RDL. A bottom surface of the RDL is in contact with the TME. The structure further includes a second dielectric layer on the RDL and a polyimide layer on the second dielectric layer, where a portion of the polyimide layer is on a top surface of the RDL.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a top metallization (TME) on a semiconductor substrate;
   a first dielectric layer on the TME, wherein the first dielectric layer comprises:
   a metal-insulator-metal (MIM) structure; and
   a redistribution layer (RDL), wherein a bottom surface of the RDL is in contact with the TME;
   a second dielectric layer on the RDL; and
   a polyimide layer on the second dielectric layer, wherein a portion of the polyimide layer is on a top surface of the RDL and comprises a circular shape or an elliptical shape.

2. The structure of claim 1, further comprising:
   an under bump metallization (UBM) on the polyimide layer, wherein a portion of the UBM is on the top surface of the RDL;
   a copper (Cu) bump on the UBM; and
   a solder on the Cu bump.

3. The structure of claim 1, wherein a thickness of the portion of the polyimide layer is between about 0.8 μm and about 2.7 μm.

4. The structure of claim 1, wherein the portion of the polyimide layer comprises sidewalls with an angle between about 40° and about 90°.

5. A structure, comprising:
   a redistribution layer (RDL) on a substrate;
   a dielectric layer on the RDL;
   a polyimide layer on the dielectric layer; and
   an under bump metallization (UBM) through the polyimide layer and in contact with the RDL, wherein a top surface of the UBM is above a top surface of the polyimide layer.

6. The structure of claim 5, wherein a portion of the polyimide layer is in contact with a side surface of the dielectric layer and a top surface of the RDL.

7. The structure of claim 5, wherein the UBM is in contact with a slanted side surface of the polyimide layer.

8. The structure of claim 5, wherein the polyimide layer comprises a slanted surface, and wherein the slanted surface comprises:
   a first surface connected to a top surface of the polyimide layer;
   a second surface connected to a bottom surface of the polyimide layer; and
   a third surface connected to the first and second surfaces.

9. The structure of claim 8, wherein:
   an angle between the third surface and the bottom surface is greater than an angle between the first surface and the top surface; and
   the angle between the third surface and the bottom surface is greater than an angle between the second surface and the bottom surface.

10. The structure of claim 9, wherein the angle between the third surface and the bottom surface is between about 50° and about 80°.

11. The structure of claim 5, wherein the polyimide layer comprises a cross-linker with a mixing ratio between about 0.8% and about 2.2%.

12. The structure of claim 5, wherein the polyimide layer comprises a photo initiator with a mixing ratio between about 0.1% and about 2%.

13. The structure of claim 5, wherein the polyimide layer comprises an inhibitor with a mixing ratio between about 0.8% and about 2.2%.

14. A structure, comprising:
   a first dielectric layer on a substrate;
   a redistribution layer (RDL) on the first dielectric layer;
   a second dielectric layer on the RDL;
   a polyimide layer on the second dielectric layer, wherein a bottom surface of the polyimide layer has a ring shape;
   an under bump metallization (UBM) in contact with a side surface of the polyimide layer and a top surface of the RDL; and
   a copper bump on the UBM.

15. The structure of claim 14, wherein:
a bottom portion of the UBM is surrounded by a bottom portion of polyimide layer.

16. The structure of claim 15, wherein a thickness of the ring shape is between about 0.8 μm and about 2.7 μm.

17. The structure of claim 15, wherein the copper bump is in contact with a side surface of the UBM and a top surface of the bottom portion of the UBM.

18. The structure of claim 14, wherein a portion of the RDL is in contact with a side surface of the first dielectric layer.

19. The structure of claim 14, wherein the first dielectric layer comprises a titanium nitride (TiN) layer and a metal-insulator-metal (MIM) structure in contact with the TiN layer.

20. The structure of claim 19, wherein the MIM structure comprises:
a first conductive layer and a second conductive layer; and
an insulating layer interposed between the first and second conductive layers.

* * * * *